United States Patent
Lee et al.

(10) Patent No.: US 7,385,428 B2
(45) Date of Patent: *Jun. 10, 2008

(54) DIGITAL DELAY LOCKED LOOP CAPABLE OF CORRECTING DUTY CYCLE AND ITS METHOD

(75) Inventors: Hyun-Woo Lee, Kyoungki-do (KR); Jong-Tae Kwak, Kyoungki-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/646,054

(22) Filed: Dec. 27, 2006

(65) Prior Publication Data

US 2007/0103212 A1 May 10, 2007

Related U.S. Application Data

(63) Continuation of application No. 11/020,491, filed on Dec. 21, 2004, now Pat. No. 7,161,397.

(30) Foreign Application Priority Data

Jun. 30, 2004 (KR) ............................... 2004-49848

(51) Int. Cl.
*H03L 7/06* (2006.01)
(52) U.S. Cl. ...................................... 327/149; 327/158
(58) Field of Classification Search .................... None
See application file for complete search history.

(56) References Cited

U.S. PATENT DOCUMENTS

| | | | | |
|---|---|---|---|---|
| 6,181,178 B1 * | 1/2001 | Choi | .......................... | 327/175 |
| 6,342,801 B1 * | 1/2002 | Shin | .......................... | 327/175 |
| 6,417,715 B2 * | 7/2002 | Hamamoto et al. | ......... | 327/291 |
| 6,452,432 B2 * | 9/2002 | Kim | .......................... | 327/158 |
| 6,798,259 B2 * | 9/2004 | Lin | .......................... | 327/153 |
| 6,801,472 B2 * | 10/2004 | Lee | .......................... | 365/233 |
| 6,943,602 B1 * | 9/2005 | Lee | .......................... | 327/158 |
| 7,227,809 B2 * | 6/2007 | Kwak | .......................... | 365/233 |
| 7,268,601 B2 * | 9/2007 | Kwak | .......................... | 327/158 |
| 7,271,638 B2 * | 9/2007 | Takai et al. | ................. | 327/261 |
| 2004/0066873 A1 * | 4/2004 | Cho et al. | ................... | 375/376 |
| 2004/0223571 A1 * | 11/2004 | Donnelly et al. | ........... | 375/371 |
| 2005/0122153 A1 * | 6/2005 | Lin | .......................... | 327/291 |

FOREIGN PATENT DOCUMENTS

| | | |
|---|---|---|
| JP | 2004-129255 | 4/2004 |
| KR | 1020020054119 A | 7/2002 |
| KR | 1020040021478 A | 3/2004 |

* cited by examiner

*Primary Examiner*—Cassandra Cox
(74) *Attorney, Agent, or Firm*—Blakely, Sokoloff, Taylor & Zafman LLP

(57) ABSTRACT

An apparatus for adjusting a clock signal, including: a clock multiplexing unit for receiving an external clock signal, an external clock bar signal and a feed-backed clock signal in order to select one of the external clock signal and the external clock bar signal as an output signal of the clock multiplexing unit based on a result of comparing a phase of the external clock signal with a phase of the feed-backed clock signal; and a delay locked loop (DLL) for generating a duty corrected clock signal and the feed-backed clock signal in response to the output signal of the clock multiplexing unit.

22 Claims, 6 Drawing Sheets

FIG. 7
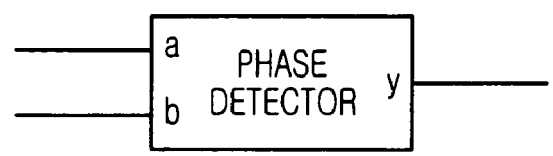
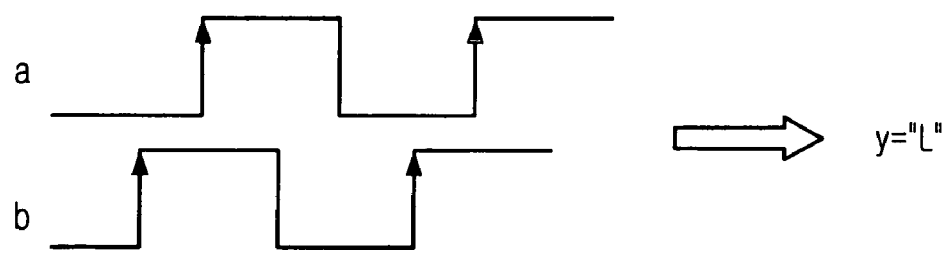
⇒ y="L"
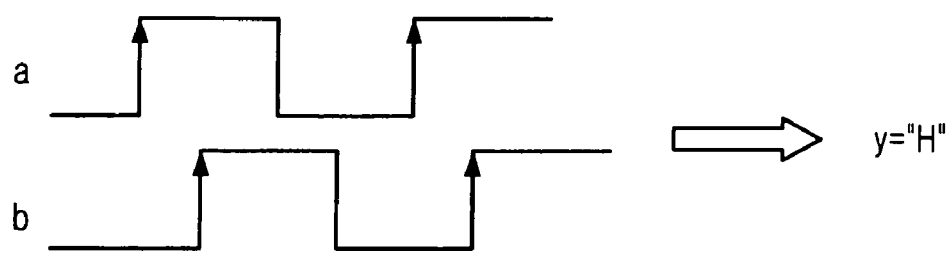
⇒ y="H"

DIGITAL DELAY LOCKED LOOP CAPABLE OF CORRECTING DUTY CYCLE AND ITS METHOD

The present patent application is a Continuation of application Ser. No. 11/020,491, filed Dec. 21, 2004 now U.S. Pat. No. 7,161,397.

FIELD OF INVENTION

The present invention relates to a delay locked loop (DLL) for compensating a clock skew between an external clock signal and an internal clock signal; and, more particularly, to a DLL capable of correcting a duty cycle of the external clock signal.

DESCRIPTION OF PRIOR ART

Generally, in a synchronous semiconductor memory device, data access operations such as a read operation and a write operation are performed in synchronization with rising and falling edges of an external clock signal.

Since there is a time delay while the external clock signal is inputted to the synchronous semiconductor memory device in order to be used as an internal clock signal of the synchronous semiconductor memory device, a delay locked loop (DLL) is employed for synchronizing the internal clock signal with the external clock signal by compensating a clock skew between the internal clock signal and the external clock signal.

As an operational speed of the synchronous semiconductor memory device is increased, an apparatus for synchronizing the internal clock signal with the external clock signal and correcting a duty cycle of the external clock signal has been required for enhancing a performance of the synchronous semiconductor memory device. Therefore, various techniques of the DLL have been introduced for compensating the clock skew between the internal clock signal and the external clock signal and for correcting the duty cycle.

FIG. 1 is a block diagram showing a conventional DLL disclosed in a commonly owned copending application, U.S. Ser. No. 10/331,412, filed on Dec. 30, 2002, entitled "DIGITAL DLL APPARATUS FOR CORRECTING DUTY CYCLE AND METHOD THEREOF", which is incorporated herein by reference.

As shown, the conventional DLL includes a buffer 110, a delay line unit 120, a duty error controller 130, a first delay model unit 140, a first direct phase detector 150, a second delay model unit 160 and a second direct phase detector 170.

The buffer 110 receives an external clock signal ext_clk and generates a first internal clock signal by buffering the external clock signal ext_clk. The first internal clock signal is inputted to the delay line unit 120.

The delay line unit 120 receives the first internal clock signal and also receives a first and a second detection signals from the first and the second direct phase detectors 150 and 170. The delay line unit 120 delays the first internal clock signal based on the first and the second detection signals and outputs a first delayed internal clock signal intclk1 and a second delayed internal clock signal intclk2 to the duty error controller 130.

In detail, the delay line unit 120 includes a first controller 121, a first delay line 122, a second controller 123 and a second delay line 124.

The first controller 121 generates a first control signal for controlling a delay amount according to the first detection signal and outputs the first control signal to the first delay line 122.

The first delay line 122 receives the first control signal and the first internal clock signal. The first internal clock signal is delayed according to the first control signal through the delay line 122. That is, the first delay line 122 generates the first delayed internal clock signal intclk1 by delaying the first internal clock signal according to the first control signal. The first delayed internal clock signal intclk1 is inputted to the duty error controller 130.

The second controller 123 outputs a second control signal to the second delay line 124 for controlling a delay amount according to the second detection signal.

The second delay line 124 receives the second control signal and the first internal clock signal. The second delay line 124 delays the first internal clock signal based on the second control signal. Then, the delayed first internal clock signal is inverted and outputted as the second delayed internal clock signal intclk2. The second delayed internal clock signal intclk2 is outputted to the duty error controller 130.

The duty error controller 130 receives the first and the second delayed internal clock signals intclk1 and intclk2. The duty error controller 130 generates a first duty controlled clock signal int_clk and a second duty controlled clock signal intclk2' by adjusting falling edges of the first and the second duty controlled clock signals int_clk and intclk2' to a middle of the falling edges of the first and the second duty controlled clock signals int_clk and intclk2'. Herein, after the first and the second duty controlled clock signals int_clk and intclk2' are duty corrected by shifting their falling edges as mentioned above, a 50% duty ratio. The first and the second duty controlled clock signals int_clk and intclk2' are respectively outputted to the first and the second delay model units 140 and 160.

The duty error controller 130 includes a first phase detector 131, a mixer controller 132, a first phase mixer 133 and a second phase mixer 134.

The first and the second delayed internal clock signals intclk1 and intclk2 are inverted and inputted to the first phase detector 131. The first phase detector 131 compares phases of falling edges of the first and the second delayed internal clock signals intclk1 and the intclk2 in order to determine which one of their falling edges leads the other for generating a phase detection signal based on the comparison result. The phase detection signal is outputted to the mixer controller 132.

The mixer controller 132 receives the phase detection signal to determine a weight k, which contains a phase difference between two falling edges of the first and the second delayed internal clock signals intclk1 and intclk2, according to the phase detection signal. The weight k is outputted to the first and the second phase mixers 133 and 134. The weight k includes the plural number of weight signals.

The first phase mixer 133 receives the weight k, the first and the second delayed internal clock signals intclk1 and intclk2. The first phase mixer 133 calculates a difference value by subtracting the weight k from 1. By applying the difference value to the first delayed internal clock signal intclk1 and applying the weight k to the second delayed internal clock signals intclk2, the first phase mixer 133 generates a first duty controlled clock signal int_clk. The first duty controlled clock signal int_clk is outputted to the first delay model unit 140.

The second phase mixer 134 receives the weight k and calculates a difference value by subtracting the weight k from 1. The second phase mixer 134 generates a second duty controlled clock signal intclk2' by applying the weight k to the first delayed internal clock signal intclk1 and applying the difference value to the second delayed internal clock signal intclk2. The second phase mixer 134 outputs the second duty controlled clock signal intclk2' to the second delay model unit 160.

Herein, as above mentioned, the first and the second duty controlled clock signals int_clk and intclk2' are generated by adjusting their falling edges to a middle of their falling edges; and a direction and a amount of the phase shift is determined by the weight k and the difference value.

The first delay model unit 140 receives the first duty controlled clock signal int_clk and estimates a delay amount generated while the external clock signal ext_clk is passed through the conventional DLL to be outputted as the first and the second duty controlled clock signals int_clk and intclk2'. The first delay model unit 140 generates a first compensated clock signal iclk1 based on the estimated delay amount and outputs the first compensated clock signal iclk1 to the first direct phase detector 150.

The first direct phase detector 150 receives the external clock signal ext_clk and the first compensated clock signal iclk1 to thereby generate the first detection signal in response to a result of comparing the external clock signal ext_clk with the first compensated clock signal iclk1. The first detection signal is inputted to the delay line unit 120.

The second delay model unit 160 receives the second duty controlled clock signal intclk2' and estimates a delay amount generated while the second duty controlled clock signal intclk2' travels from the conventional DLL to a data input/output pin (DQ pin). The second delay model unit 160 generates a second compensated clock signal iclk2 based on the estimated delay amount and outputs the second compensated clock signal iclk2 to the second direct phase detector 170.

The second direct phase detector 170 receives the external clock signal ext_clk and the second compensated clock signal iclk2 to generate the second detection signal based on a result of comparing the external clock signal ext_clk and the second compensated clock signal iclk2. The generated second detection signal is inputted to the delay line unit 120.

However, using the first and the second delay lines 122 and 124, the conventional DLL shown in FIG. 1 synchronizes both of the first and the second compensated clock signals iclk1 and iclk2 with a rising edge of the external clock signal ext_clk respectively. Therefore, each of the first and the second delay lines should have a delay amount of 1tCK as shown in FIG. 2. As a result, whole delay amount of both the first and the second delay lines should have a delay amount of 2tCK.

Furthermore, if a conventional DLL has a dual delay line structure, the whole delay amount becomes 4tCK. Herein, in the dual delay line structure, a first and a second delay lines are respectively constituted with a coarse and a fine delay lines. As result, a size of a semiconductor memory device is increased, and a power consumption of the semiconductor memory device is also increased.

SUMMARY OF INVENTION

It is, therefore, an object of the present invention to provide a DLL device capable of reducing a length of a delay line and reducing a delay locking time.

In accordance with an aspect of the present invention, there is provided a semiconductor device for adjusting a clock signal, including: a clock multiplexing unit for receiving an external clock signal, an external clock bar signal and a feed-backed clock signal in order to select one of the external clock signal and the external clock bar signal as an output signal of the clock multiplexing unit based on a result of comparing a phase of the external clock signal with a phase of the feed-backed clock signal; and a delay locked loop (DLL) for generating a duty corrected clock signal and the feed-backed clock signal in response to the output signal of the clock multiplexing unit.

In accordance with another aspect of the present invention, there is provided a method of generating a duty corrected clock signal using an external clock signal, including the steps of: generating a rising edge clock signal whose rising edge is synchronized with a rising edge of the external clock signal; generating a falling edge clock signal whose falling edge is synchronized with a rising edge of the external clock signal; selecting one of the rising edge clock signal and the falling edge clock signal based on a feed-backed clock signal; generating a first delay locked clock signal and a second delay locked clock signal by delaying the one of the rising edge clock signal and the falling edge clock signal within one clock cycle of the external clock signal based on a first phase detecting signal and a second phase detecting signal; and generating a first output clock signal and a second output clock signal by delaying the first delay locked clock signal and the second delay locked clock signal; and generating the duty corrected clock signal by correcting duty cycles of the first output clock signal and the second output clock signal.

BRIEF DESCRIPTION OF THE DRAWINGS

The above and other objects and features of the present invention will become apparent from the following description of preferred embodiments taken in conjunction with the accompanying drawings, in which:

FIG. 7 is a timing diagram showing an operation of a first and a second phase detectors shown in FIG. 6.

DETAILED DESCRIPTION OF INVENTION

Hereinafter, a delay locked loop in accordance with the present invention will be described in detail referring to the accompanying drawings.

Figure 1:
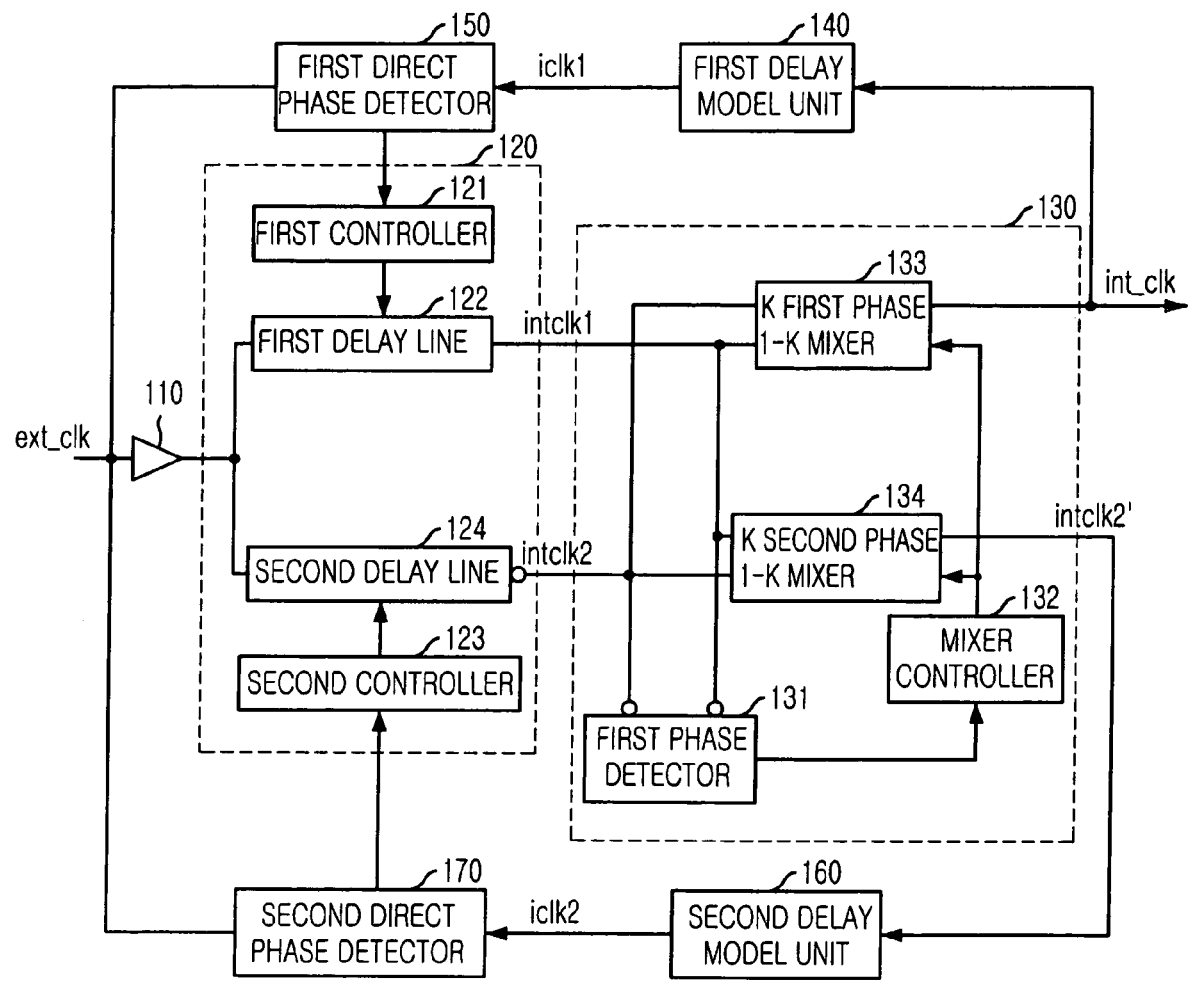
FIG. 1 is a block diagram showing a conventional DLL.
Figure 2:
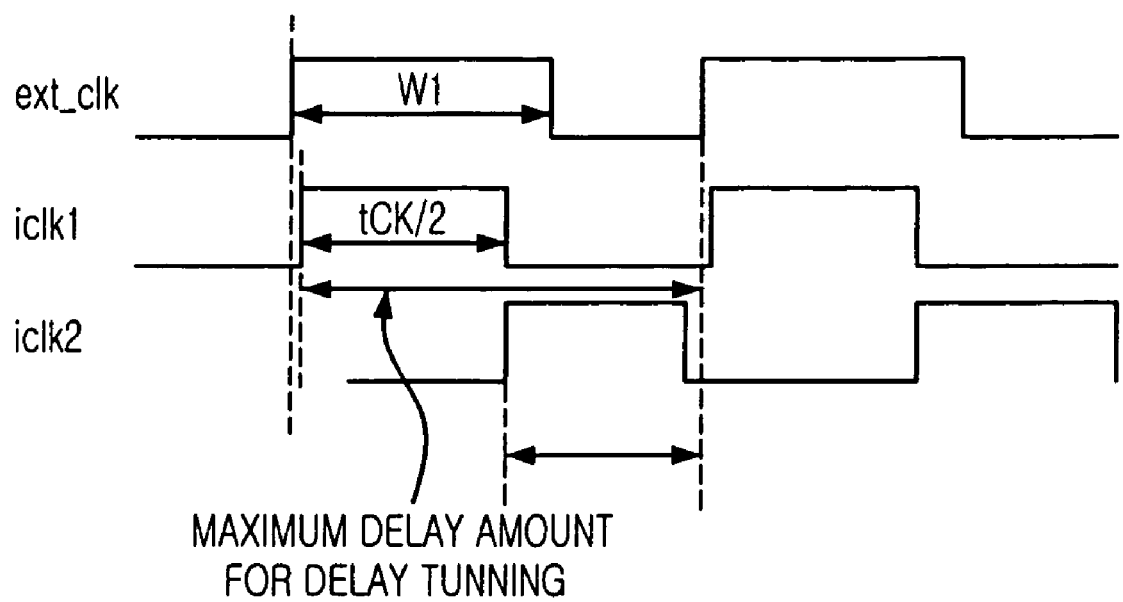
FIG. 2 is a timing diagram showing an operation of the conventional DLL shown in FIG. 1.
Figure 3:
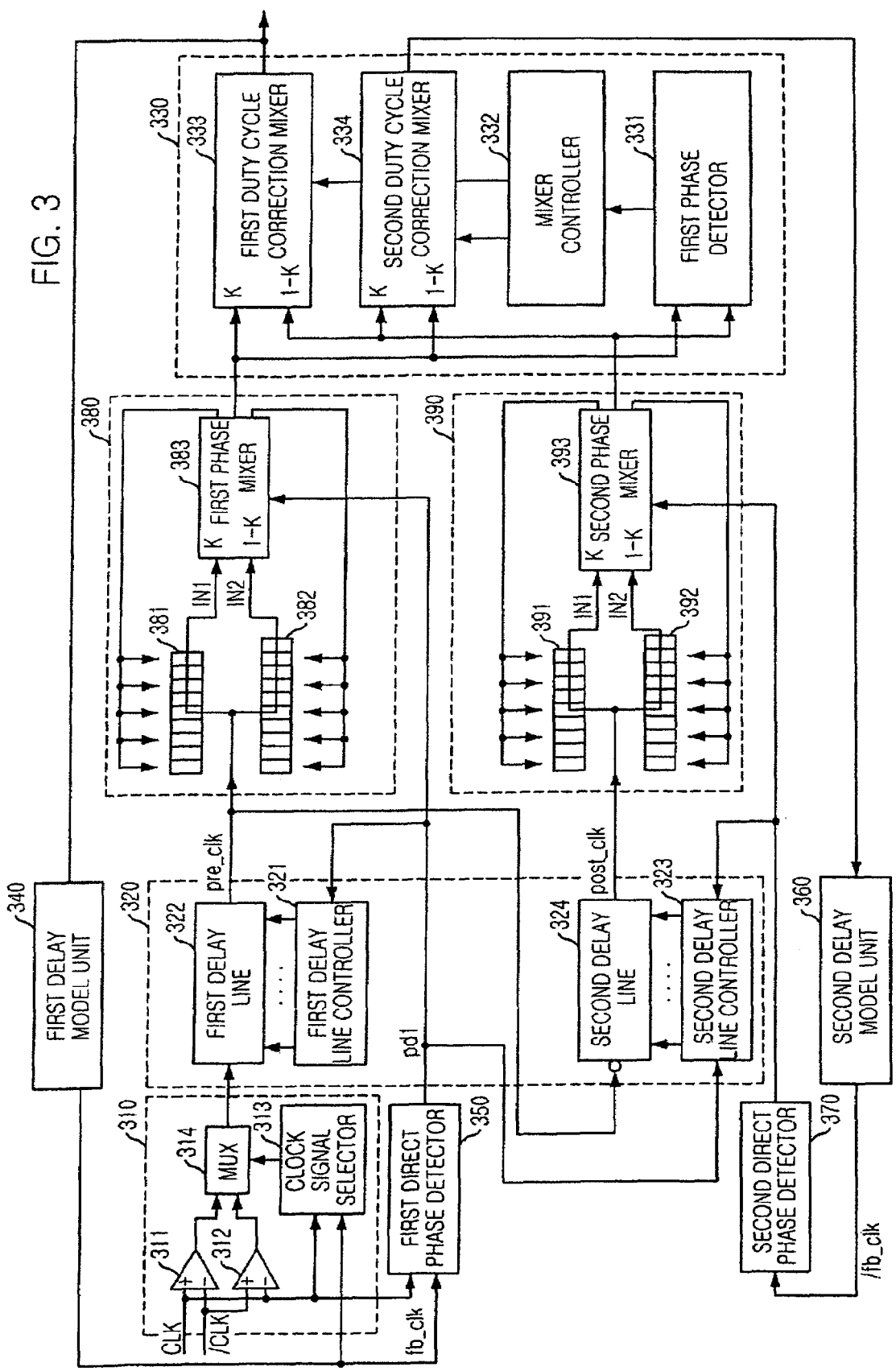
FIG. 3 is a block diagram showing a DLL in accordance with the present invention.

FIG. 3 is a block diagram showing a delay locked loop (DLL) in accordance with the present invention.

As shown, the DLL includes a clock multiplexing unit 310, a first direct phase detector 350, a second direct phase detector 370, a first delay model unit 340, a second delay model unit 360, a delay line unit 320, a first clock phase control unit 380, a second clock phase control unit 390 and a duty cycle correction unit 330.

The clock multiplexing unit 310 receives an external clock signal CLK and an inverted signal of the external clock signal CLK, i.e., an external clock bar signal /CLK. The clock multiplexing unit 310 selects one of the external clock signal CLK and the external clock bar signal /CLK in order to output the selected clock signal to the delay line unit 320 so that the selected clock signal can be delay locked within tCK/2 in the delay line unit 320, wherein the tCK is a clock cycle of the external clock signal CLK.

The clock multiplexing unit 310 includes a first input buffer 311, a second input buffer 312, a clock signal selector 313 and a multiplexer 314.

The first input buffer 311 receives the external clock signal CLK and the external clock bar signal /CLK respectively through a non-inverting terminal (+) and an inverting terminal (−) of the first input buffer 311 in order to output the external clock signal CLK as a rising edge clock signal rclk by buffering the external clock signal CLK. The second input buffer 312 receives the external clock bar signal /CLK respectively through an inverting terminal (−) and a non-inverting terminal (+) of the second input buffer 312 in order to output the external clock bar signal /CLK as a falling edge clock signal fclk by buffering the external clock bar signal /CLK. Herein, the rising edge clock signal rclk is synchronized with the external clock signal CLK, and the falling edge clock signal fclk is synchronized with the external clock bar signal /CLK.

The clock signal selector 313 compares a phase of the external clock signal CLK with a phase of a feed-backed clock signal fb_clk outputted from the first delay model unit 340 in order to generate a clock selection signal clk_sel.

The multiplexer 314 selects one of the rising edge clock signal rclk and the falling edge clock signal fclk based on the clock selection signal clk_sel in order to output the selected signal to the delay line unit 320.

The delay line unit 320 includes a first delay line 322, a first delay line controller 321, a second delay line 324 and a second delay line controller 323.

The rising edge clock signal rclk or the falling edge clock signal fclk selected by the multiplexer is delay locked within tCK/2 in the first delay line 322. Thereafter, the first delay line 320 outputs a first delay locked clock signal pre_clk to the first clock phase control unit 380 and the second delay line 324.

Meanwhile, the first direct phase detector 350 generates a first phase detecting signal pd1. The first phase detecting signal pd1 is inputted to both of the first delay line controller 321 and the second delay line controller 323. The first and the second delay line controllers 321 and 323 respectively control delay amounts of the first and the second delay lines 322 and 324 based on the first phase detecting signal pd1. Since the first phase detecting signal pd1 is inputted both of the first and the second delay line controllers 321 and 323, the first delay locked clock signal pre_clk is delayed in the second delay line 324 for the same delay time as that of the first delay line 322. The second delay line 324 outputs a second delay locked clock signal by delaying the first delay locked clock signal pre_clk.

Figure 4:
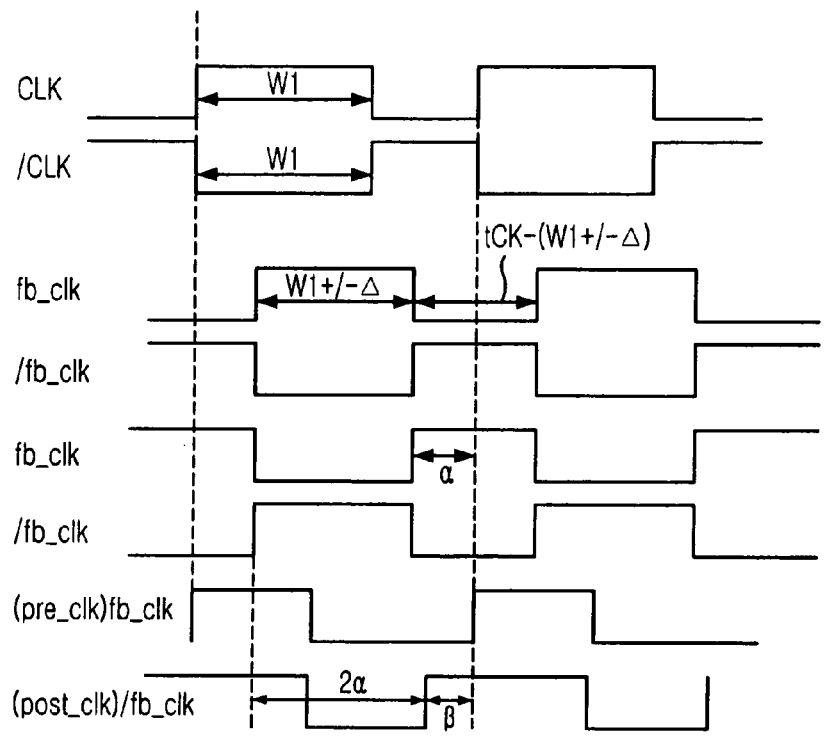
FIG. 4 is a timing diagram showing an operation of the DLL shown in FIG. 3.

FIG. 4 is a timing diagram showing an operation of the digital DLL.

As shown, the feed-backed clock signal fb_clk should be delayed for a delay amount of α to be synchronized with the external clock signal CLK. Therefore, the first direct phase detector 350 outputs the first phase detecting signal pd1 to the first and the second delay line controllers 321 and 323 for controlling the first and the second delay lines 322 and 324 to have the delay amount of α. Subsequently, the first delay line 322 delays the feed-backed clock signal fb_clk for the delay amount of α, and, then, outputs the delayed signal as the first delay locked clock signal pre_clk. As a result, a rising edge of the first delay locked clock signal pre_clk is synchronized with a rising edge of the external clock signal CLK.

Meanwhile, the first delay locked clock signal pre_clk is delayed for the delay amount of α by the second delay line 324. Herein, since the first and the second delay lines 322 and 324 are connected in series, the second delay line 324 receives the first delay locked clock signal pre_clk from the first delay line 322. Subsequently, the second delay locked clock signal post_clk outputted from the second delay line 324 becomes a delayed version of the feed-backed clock bar signal/fb_clk inputted to the second direct phase detector 370 having a delay amount of 2α.

At this time, since the first delay locked clock signal pre_clk is synchronized with the external clock signal CLK, a delay amount of the first delay line 322 is no longer changed. The second delay locked clock signal post_clk is still required to be delayed for a delay amount of β to be synchronized with the external clock signal CLK. Therefore, the second delay locked clock signal post_clk is delayed for the delay amount of β under control of the second direct phase detector 370 and the second delay line controller 323.

Above-mentioned delay locking operation of the first and the second delay lines 322 and 324 is referred as a coarse delay operation.

Meanwhile, the first clock phase control unit 380 includes a first fine delay line 381, a second fine delay line 382 and a first phase mixer 383. Likewise, the second clock phase control unit 390 includes a third fine delay line 391, a fourth fine delay line 392 and a second phase mixer 393.

The first and the second fine delay lines 381 and 382 perform a fine delay operation to the first delay locked clock signal pre_clk respectively. Likewise, the third and the fourth fine delay lines 391 and 392 perform the fine delay operation to the second delay locked clock signal post_clk respectively. The fine delay operation is performed in order to finely delay the first and the second delay locked clock signal pre_clk and post_clk for phase locking. The fine delay operation is performed independently of the coarse delay operation.

Since an operation of the first clock phase control unit 380 is same to that of the second clock phase control unit 390, only the operation of the first clock phase control unit 380 is described below.

The first delay locked clock signal pre_clk is inputted to the first and the second fine delay lines 381 and 382. Herein, the number of unit delay cells included in the first fine delay line 381 can be smaller that that of the second fine delay line 382 by one. That is, a weight value K is determined based on the first phase detecting signal pd1; and, the number of unit delay cells, through which the first delay locked clock signal pre_clk is passed in the first fine delay line 381, is determined based on a control signal outputted from the first phase mixer 383. Herein, the number of unit delay cells of the first fine delay line 381 passed by the first delay locked clock signal pre_clk is smaller than that of the second fine delay line 382 passed by the first delay locked clock signal pre_clk by one.

That is, if the number of unit delay cells passed by the first delay locked clock signal pre_clk in the first fine delay line is 1, 3 or 5, the number of unit delay cells passed by the first delay locked clock signal pre_clk in the second fine delay line is 2, 4 or 6 respectively. For example, if the first delay locked clock signal pre_clk is passed through three unit delay cells in the first fine delay line 381, the first delay locked clock signal pre_clk is passed through four unit delay cells in the second fine delay line 382.

The first and the second fine delay lines 381 and 382 respectively output a first input signal IN1 and a second input signal IN2 to the first phase mixer 383.

If the weigh value K is set to 0 based on the first phase detecting signal pd1, the first fine delay line 381 outputs the first delay locked clock signal pre_clk without delaying the first delay locked clock signal pre_clk.

However, if it is detected that a phase of the feed-backed clock signal fb_clk leads a phase of the external clock signal CLK by the first direct phase detector 351, the first phase mixer 383 increases the weight value K. The more the weight value K is approached to 1, the more an outputted clock signal of the phase mixer 383 is synchronized with the second input signal IN2.

Thereafter, if the weight value becomes 1, the first phase mixer 383 outputs the second input signal IN2 as the outputted clock signal of the phase mixer 383. At this time, if a phase of the feed-backed clock signal fb_clk is still leads a phase of the external clock signal CLK, the first phase mixer 383 shifts a delay amount of the first fine delay line 381 in a left direction. That is, the number of unit delay cells passed by the first delay locked clock signal pre_clk is increased by two, e.g., 1 to 3 or 3 to 5. At this time, since the weigh value K is 1, the outputted clock signal of the first phase mixer 383 is not influenced by delay amount variance of the first fine delay line 381.

If it is required that the feed-backed clock signal fb_clk is more delayed after left-shifting the delay amount of the first fine delay line 381, the weight value K is decreased. If the weight value K is decreased, a phase of the outputted clock signal of the first phase mixer 383 is approached to a phase of the first input signal IN1.

Meanwhile, for decreasing a delay amount of the first and the second fine delay lines 383 and 393, the above-mentioned operation can be performed in an opposite way.

In addition, the first phase mixer 383 generates a plurality of control signals, i.e., a shift-right signal and a shift-left signal for controlling a delay amount of the first and the second fine delay lines 381 and 382. The first phase mixer 383 can be designed by various design techniques, e.g., an up-down counter or a decoder, which is well known to those skilled in the art.

Since a delay locking operation is almost completed by the coarse delay operation, the fine delay operation is performed in order to finely adjust a small delay variance generated due to external noises such as a power supply voltage variance. Therefore, a physical delay line length for adjusting the small delay variance is an enough physical length of the first to the fourth fine delay lines 381, 382 and 392.

Figure 5:
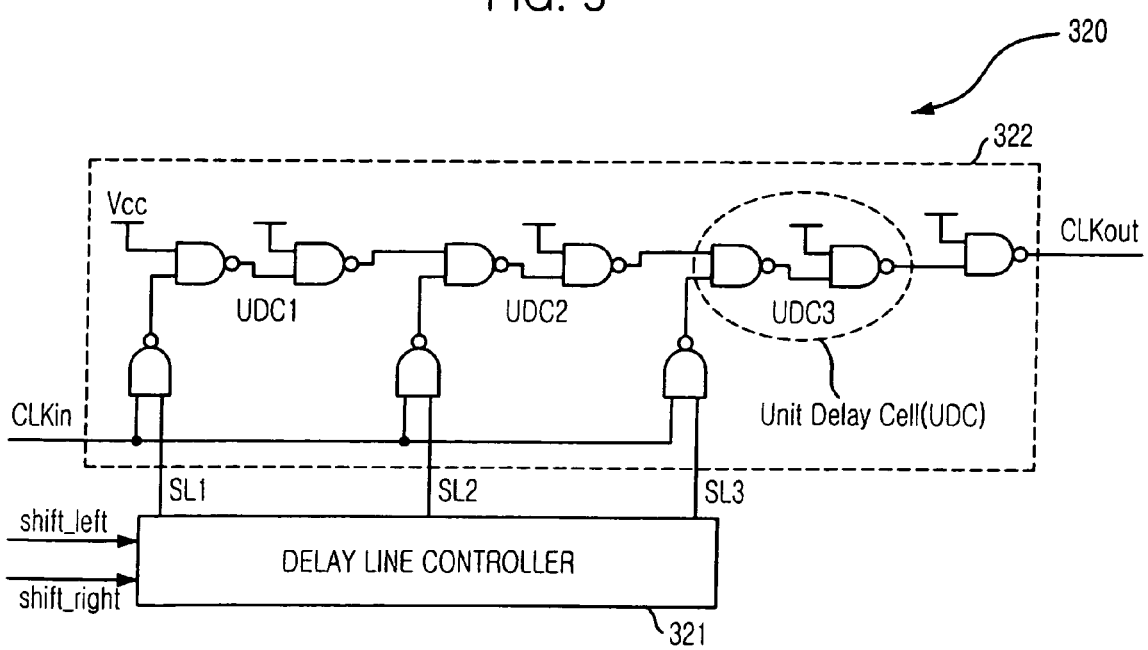
FIG. 5 is a schematic circuit diagram showing a delay line unit shown in FIG. 3.

FIG. 5 is a schematic circuit diagram showing the delay line unit 320 shown in FIG. 3.

As shown, the first delay line controller 321 generates a first to a third shift-left signals SL1 to SL3 based on the first phase detecting signal pd1. The first delay line 322 delays input signals of the first line 322 according to the first to the third shift-left signals SL1 to SL3. The second delay line 324 has the same structure with the first delay line 322.

Figure 6:
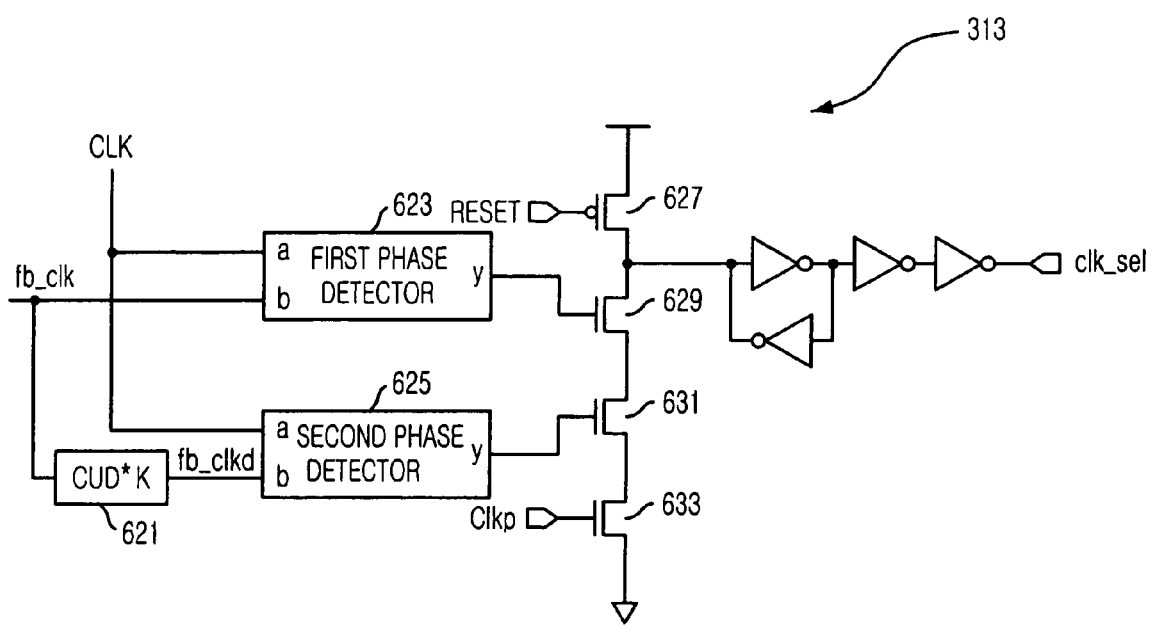
FIG. 6 is a schematic circuit diagram showing a clock signal selector shown in FIG. 3.

FIG. 6 is a schematic circuit diagram showing the clock signal selector 313 shown in FIG. 3.

As shown, the clock signal selector 313 includes a feed-backed clock delay unit 621, a first phase detector 623, a second phase detector 625, a p-channel metal oxide semiconductor (PMOS) transistor 627 and a first to a third n-channel metal oxide semiconductor (NMOS) transistors 629 to 633.

The feed-backed clock delay unit 621 delays the feed-backed clock signal for a predetermined delay time in order to generate a delayed feed-backed clock signal fb_clkd. The first phase detector 623 compares phases of the external clock signal CLK and the feed-backed clock signal fb_clk. The second phase detector 625 compares phases of the external clock signal CLK and the delayed feed-backed clock signal fb_clkd.

The feed-backed clock delay unit 621 includes K numbers of unit delay cells. The K numbers of unit delay cells are required numbers of unit delay cells in order to delaying the feed-backed clock signal avoiding a dead zone.

FIG. 7 is a timing diagram showing an operation of the first and the second phase detectors 623 and 625.

As shown, if a phase of a signal inputted to a first terminal 'a' leads a phase of a signal inputted to a second terminal 'b', an output signal of the first phase detector 623 or the second phase detector 625 is in a logic high level. On the other hand, if a phase of a signal inputted to a first terminal 'a' lags behind a phase of a signal inputted to a second terminal 'b', an output signal of the first phase detector 623 or the second phase detector 625 is in a logic low level.

Therefore, if a phase of the external clock signal CLK leads phases of the feed-backed clock signal fb_clk and the delayed feed-backed clock signal fb_clkd, output signals of the first and the second phase detectors 623 and 625 are in a logic high level. As a result, the first and the second NMOS transistors 629 and 631 are turned on; and, thus, the clock selection signal clk_sel becomes in a logic high level. Therefore, the multiplexer 314 shown in FIG. 3 selects the falling edge clock signal fclk in response to the clock selection signal which is in a logic high level. Except in the above-mentioned case, the multiplexer selects the rising edge clock signal rclk.

As described above, the DLL in accordance with the present invention can reduce a physical length of a delay line by using the clock multiplexing unit 310. Therefore, the DLL can reduce a required time for delay locking a clock signal.

In addition, a power consumption of the DLL can be reduced since a physical length of a delay line is reduced.

The present application contains subject matter related to Korean patent application No. 2004-49848, filed in the Korean Patent Office on Jun. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device including a circuit for adjusting a clock signal, the circuit comprising:
    an input buffer unit for generating a rising edge clock signal and a falling edge clock signal;
    a clock selection unit for selecting one of the rising edge clock signal and the falling edge clock signal in response to an external clock signal and a feed-backed clock signal; and
    a delay locked loop (DLL) for generating a duty corrected clock signal and the feed-backed clock signal in response to an output of the clock selection unit,
    wherein the DLL includes:
        a first delay line for delaying the output of the clock selection unit; and a second delay line for delaying an output of the first delay line.

2. The semiconductor memory device as recited in claim 1, wherein a rising edge of the rising edge clock signal is synchronized with a rising edge of the external clock and a falling edge of the falling edge clock signal is synchronized with a rising edge of the external clock.

3. The semiconductor memory device as recited in claim 2, wherein the DLL includes:
- a delay line unit for generating a delay locked clock signal by delaying the output of the clock selection unit based on a first phase detecting signal and a second phase detecting signal;
- a duty cycle correction unit for generating the duty corrected clock signal by correcting a duty cycle of the delay lock clock signal; and
- a clock feed back unit for receiving the duty corrected clock signal in order to generate the first phase detecting signal, the second phase detecting signal, the feed backed clock signal, and a feed backed clock bar signal.

4. The semiconductor memory device as recited in claim 3, wherein the input buffer unit includes:
- a first input buffer for receiving the external clock signal through its first input terminal and receives an external clock bar signal through its second input terminal and generating the rising edge clock signal; and
- a second input buffer for receiving the external clock signal through its second input terminal and receives the external clock bar signal through its first input terminal and generating the falling edge clock signal.

5. The semiconductor memory device as recited in claim 4, wherein the clock selection unit includes:
- a clock signal selector for generating a clock selection signal by comparing a phase of the external clock with a phase of the feed-backed clock signal; and
- a multiplexer for receiving the external clock signal and the external clock bar signal and selecting one of the rising edge clock signal and the falling edge clock signal based on the clock selection signal.

6. The semiconductor memory device as recited in claim 4, the clock signal selector includes:
- a feed-backed clock signal delay unit for delaying the feed-backed clock signal in order to generate a delayed feed-backed clock signal;
- a first phase detector for comparing phases of the external clock signal and the feed-backed clock signal; and
- a second phase detector for comparing phases of the external clock signal and the delayed feed-backed clock signal.

7. The semiconductor memory device as recited in claim 6, wherein the feed-backed clock signal delay unit includes a plurality of unit delay cells for delaying the feed-backed clock signal avoiding a dead zone.

8. The semiconductor memory device as recited in claim 3, wherein the delay line unit includes:
- a first delay line unit for receiving one of the rising edge clock signal and the falling edge clock signal in order to generate a first coarsely delay locked clock signal and a second coarsely delay locked clock signal based on the first phase detecting signal and the second phase detecting signal; and
- a second delay line unit for receiving the first coarsely delay locked clock signal and the second coarsely delay locked clock signal in order to generate a first finely delay locked clock signal and a second finely delay locked clock signal, wherein
- the delay locked clock signal includes the first finely delay locked clock signal and the second finely delay locked clock signal.

9. The semiconductor memory device as recited in claim 8, wherein the first delay line unit includes:
- the first delay line for delaying the one of the rising edge clock signal and the falling edge clock signal in order to generate the first coarsely delay locked clock signal;
- a first delay line controller for controlling a delay amount of the first delay line based on the first phase detecting signal;
- the second delay line for delaying the first coarsely delay locked clock signal in order to generate the second coarsely delay locked clock signal; and
- a second delay line controller for controlling a delay amount of the second delay line based on the first phase detecting signal and the second phase detecting signal.

10. The semiconductor memory device as recited in claim 8, wherein the second delay line unit includes:
- a first clock phase control unit for receiving the first coarsely delay locked clock signal in order to generate the first finely delay locked clock signal according to the first phase detecting signal; and
- a second clock phase control unit for receiving the second coarsely delay locked clock signal in order to generate the second finely delay locked clock signal according to the second phase detecting signal.

11. The semiconductor memory device as recited in claim 10, wherein the first clock phase control unit includes:
- a first fine delay line for generating a first input clock signal by delaying the first coarsely delay locked clock signal based on a shift signal;
- a second fine delay line for generating a second input clock signal by delaying the first coarsely delay locked clock signal based on the shift signal; and
- a phase mixer for generating the first finely delay locked clock signal by mixing phases of the first input clock signal and the second input clock signal according to a weight value and for generating the shift signal, wherein
- the weight value and the shift signal is generated based on the first phase detecting signal.

12. The semiconductor memory device as recited in claim 11, wherein the first fine delay line includes N numbers of unit delay cells, and the first coarsely delay locked clock signal is passed through H numbers of unit delay cells of the first fine delay line; and the second fine delay line includes N+1 numbers of unit delay cells, and the first coarsely delay locked clock signal is passed through H+1 numbers of unit delay cells, wherein N and H are natural numbers and H is equal to or smaller than N.

13. The semiconductor memory device as recited in claim 10, wherein the second clock phase control unit includes:
- a first fine delay line for generating a first input clock signal by delaying the second coarsely delay locked clock signal based on a shift signal;
- a second fine delay line for generating a second input clock signal by delaying the second coarsely delay locked clock signal based on the shift signal; and
- a phase mixer for generating the second finely delay locked clock signal by mixing phases of the first input clock signal and the second input clock signal according to a weight value and for generating the shift signal, wherein
- the weight value and the shift signal is generated based on the second phase detecting signal.

14. The semiconductor memory device as recited in claim 13, wherein the first fine delay line includes N numbers of unit delay cells, and the second coarsely delay locked clock signal is passed through H numbers of unit delay cells of the first fine delay line; and the second fine delay line includes N+1 numbers of unit delay cells, and the second coarsely delay locked clock signal is passed through H+1 numbers of unit delay cells, wherein N and H are natural numbers and H is equal to or smaller than N.

15. The semiconductor memory device as recited in claim 12, wherein the H is an odd number, and the H numbers of unit delay cells of the first fine delay line are activated according to the shift signal.

16. The semiconductor memory device as recited in claim 15, wherein the H+1 is an even number, and the H+1 numbers of unit delay cells of the second fine delay line are activated according the shift signal.

17. The semiconductor memory device as recited in claim 14, wherein the H is an odd number, and the H numbers of unit delay cells of the first fine delay line are activated according to the shift signal.

18. The semiconductor memory device as recited in claim 17, wherein the H+1 is an even number, and the H+1 numbers of unit delay cells of the second fine delay line are activated according the shift signal.

19. A method for generating a duty corrected clock signal for use in a semiconductor memory device, comprising:
   generating a rising edge clock signal whose rising edge is synchronized with a rising edge of an external clock and a falling edge clock signal whose falling edge is synchronized with the rising edge of the external clock;
   selecting one of the rising edge clock signal and the falling edge clock signal in response to a clock selection signal generated based on the external clock signal and a feed-backed clock signal;
   generating a first delay locked clock signal and a second delay locked clock signal by delaying the selected one of the rising edge clock signal and the falling edge clock signal within one clock cycle of the external clock signal based on a first phase detecting signal and a second phase detecting signal;
   generating a first output clock signal and a second output clock signal by delaying the first delay locked clock signal and the second delay locked clock signal; and
   generating the duty corrected clock signal by correcting duty cycles of the first output clock signal and the second output clock signal,
   wherein the second delay locked clock signal is generated by delaying the first delay locked clock signal based on the first and the second phase detecting signals.

20. The method of generating the duty corrected clock signal as recited in claim 19, wherein the step of selecting one of the rising edge clock signal and the falling edge clock signal includes:
   generating a delayed feed-backed clock signal by delaying the feed-backed clock signal;
   comparing phases of the feed-backed clock signal and the external clock signal; and
   comparing phases of the delayed feed-backed clock signal and the external clock signal.

21. The method of generating the duty corrected clock signal as recited in claim 20, wherein the step of generating the first and the second output clock signals includes:
   delaying the first delay locked clock signal according to a shift signal for generating a first input clock signal;
   delaying the first delay locked clock signal according to a shift signal for generating a second input clock signal;
   mixing phases of the first input clock signal and the second input clock signal based on the first phase detecting signal,
   wherein, the number of unit delay cells for generating the first input clock signal is smaller than the number of unit delay cells for generating the second input clock signal by one.

22. The method of generating the duty corrected clock signal as recited in claim 20, wherein the step of generating the first and the second output clock signals includes:
   delaying the second delay locked clock signal according to a shift signal for generating a first input clock signal;
   delaying the second delay locked clock signal according to a shift signal for generating a second input clock signal;
   mixing phases of the first input clock signal and the second input clock signal based on the second phase detecting signal,
   wherein, the number of unit delay cells for generating the first input clock signal is smaller than the number of unit delay cells for generating the second input clock signal by one.

* * * * *